United States Patent
Hashimoto (10) Patent No.: US 6,410,977 B1
(45) Date of Patent: *Jun. 25, 2002

(54) SEMICONDUCTOR DEVICE, CIRCUIT BOARD ELECTRONIC INSTRUMENT AND METHOD OF MAKING A SEMICONDUCTOR DEVICE

(75) Inventor: Nobuaki Hashimoto, Suwa (JP)

(73) Assignee: Seiko Epson Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/204,347

(22) Filed: Dec. 4, 1998

(30) Foreign Application Priority Data

Dec. 12, 1997 (JP) ................................ 9-362749

(51) Int. Cl.[7] .......................... H01L 23/13; H01L 23/02; H01L 23/48; H01L 23/495
(52) U.S. Cl. ...................... 257/673; 257/737; 257/692; 257/693; 257/680; 257/676; 257/675; 257/713; 257/712; 257/667; 257/666; 257/738; 257/668
(58) Field of Search ................... 257/737, 738, 257/673, 676, 666, 667, 712, 675, 713, 717, 720, 692, 693, 680, 668, 700, 701

(56) References Cited

U.S. PATENT DOCUMENTS

| | | | |
|---|---|---|---|
| 5,543,663 A | * | 8/1996 | Takubo |
| 5,708,567 A | * | 1/1998 | Shim et al. |
| 5,710,695 A | * | 1/1998 | Manteghi ..................... 361/813 |
| 5,717,252 A | * | 2/1998 | Nakashima et al. ......... 257/707 |
| 5,760,465 A | * | 6/1998 | Alcoe et al. ................. 257/669 |
| 5,773,884 A | * | 6/1998 | Andros et al. .............. 257/707 |
| 5,777,386 A | * | 7/1998 | Higashi et al. ............. 257/737 |
| 5,841,192 A | * | 11/1998 | Exposito |
| 5,869,889 A | * | 2/1999 | Chia et al. .................. 257/701 |
| 5,886,399 A | * | 3/1999 | Ohtsawa et al. ............ 257/668 |
| 5,945,741 A | * | 8/1999 | Ohsawa et al. ............. 257/777 |
| 5,969,413 A | * | 10/1999 | Yane et al. .................. 257/673 |
| 5,973,389 A | * | 10/1999 | Culnane et al. ............ 257/738 |
| 5,977,633 A | * | 11/1999 | Suzuki et al. ............... 257/738 |

FOREIGN PATENT DOCUMENTS

JP 08279574 A * 10/1996

* cited by examiner

Primary Examiner—Alexander O. Williams
(74) Attorney, Agent, or Firm—Oliff & Berridge PLC (57) ABSTRACT

A semiconductor device comprising an insulating film on which a plurality of bumps and wires connected to the bumps are formed, a semiconductor chip connected to the wires and mounted to the insulating film, an epoxy resin provided in a connection portion between the semiconductor chip and the insulating film, and a radiating plate adhered to the semiconductor chip, wherein a space is formed between the insulating film and the radiating plate, and holes through which ventilation can be performed are formed in the insulating film at the positions corresponding to the space.

34 Claims, 6 Drawing Sheets

SEMICONDUCTOR DEVICE, CIRCUIT BOARD ELECTRONIC INSTRUMENT AND METHOD OF MAKING A SEMICONDUCTOR DEVICE

BACKGROUND OF THE INVENTION

1. Field of the Invention

The present invention relates to a semiconductor device and a method of manufacturing the semiconductor device, a circuit board, and an electronic instrument.

2. Description of Related Art

Bare chip mounting is ideal when continuing to pursue the miniaturization of a semiconductor device. However, because providing a guarantee of its quality and handling bare chips are difficult, the miniaturization has been achieved by fabricating the semiconductor device into a packaged form. In recent years, a ball grid array (BGA) type package has been applied to the packaged form in response to the need for high pin terminal. The BGA type package is classified into several kinds according to the base materials of the substrate. A flexible tape type BGA package using a flexible base material as the base material for the substrate has been proposed to respond to the need for mounting fine pitch pad semiconductor elements and to satisfy the demand for increasing the manufacturing efficiency by fabricating the semiconductor devices continuously by using tape-shaped packages. The BGA package is made so that bumps, i.e., external terminals, are arranged on a flexible substrate like an area array to allow surface mounting.

The heat generated by a semiconductor device has increased in connection with small sizing and speeding up. For cooling, it has been common to couple a heat spreader (radiating plate) to a semiconductor chip.

A closed area is formed by the heat spreader and a flexible tape in the BGA package. Because the air in this closed area cannot be exhausted, heating in the subsequent reflow process sometimes caused the internal air to expand, resulting in the generation of cracks.

Accordingly, a passage for exhausting air has been generally formed by providing a hole or projection in the heat spreader, which required an additional step in a process for fabricating the heat spreader. Since the heat spreader is made of a metal with a high heat conductivity, it is difficult to work the heat spreader. Therefore, the heat spreader may be distorted in the course of working. Note that these problems can occur when providing various supporters as well as the heat spreader.

SUMMERY OF THE INVENTION

The present invention has been achieved to solve the problems described above. Accordingly, an object of the present invention is to provide a semiconductor device in which generation of cracks due to heating in a reflow process can be avoided even if a heat spreader is provided, a method of manufacturing such a semiconductor device, a circuit board, and an electronic instrument.

According to a first aspect of the present invention, there is provided a semiconductor device comprising:

an insulating film on which wires are formed and in which a through-hole is formed;

a semiconductor element connected to the wires;

a resin provided in a connection portion between the semiconductor element and the insulating film; and a supporter adhered to the semiconductor element, the insulating film and the supporter defining at least a part of a space, and the space being opened to the through-hole for ventilation from outside.

In accordance with the present invention, a through-hole is formed in the insulating film, at a position corresponding to the space partitioned by members including the insulating film and the supporter. Accordingly, even if the air enclosed in this space is heated in the reflow process and caused to expand, the air can be exhausted via the through-hole in the insulating film. Because it is easier to form a through-hole in the insulating film than in the supporter, providing a through-hole in the insulating film does not unduly increase manufacturing steps or lowers the production yield.

The resin may be provided to avoid the through-hole.

The supporter may accelerate the diffusion of heat from the semiconductor element.

The semiconductor device may further comprise a plate with plane maintenance strength higher than the plane maintenance strength of the insulating film, adhered to a position in the insulating film avoiding the semiconductor element. Contours of the insulating film and the supporter may be formed to be larger than the contour of the semiconductor element. The space may be formed in an area defined by opposite sides of the insulating film and the supporter, outer peripheral end sides of the semiconductor element, and end sides of the plate on a side of the semiconductor element.

According to this configuration, a space is formed in the circumference of the semiconductor element, and a through-hole is formed in the insulating film at the position corresponding to the space. Moreover, a plate is adhered to the insulating film, so that the planarity of the insulating film can be maintained.

The semiconductor device may further comprise external electrodes formed on a first side of the insulating film opposite to a second side of the insulating film on which the wires are formed, the external electrodes being connected to the wires through the insulating film at positions outside of the semiconductor element. The semiconductor element may be adhered to the wires of the insulating film with an active surface of the semiconductor element facing the wires. The plate may be adhered to the second side of the insulating film at a position outside of the semiconductor element. The supporter may be adhered to the semiconductor element on a side opposite to the active surface and also to the plate on a side opposite to a side to which the insulating film is adhered.

The contours of the insulating film and the supporter may be formed to be larger than the contour of the semiconductor element. The supporter may have plane maintenance strength higher than the plane maintenance strength of the insulating film and may be adhered to the insulating film and the semiconductor element. The space may be formed in an area defined by opposite sides of the insulating film and the supporter, outer peripheral end sides of the semiconductor element, and end sides of the supporter on a side of the semiconductor element.

A rectangular device hole may be formed in the insulating film, the wires may be formed on the insulating film avoiding the vicinity of corners of the device hole, and the through-hole may be formed in the insulating film in the vicinity of corners of the device hole.

According to this configuration, since it is hard to form wires on the insulating film in the vicinity of corners of a device hole, the wires are formed in areas avoiding the vicinity of the corners, so that the through-hole can be formed in the vicinity of the corners to allow air to be exhausted.

According to a second aspect of the present invention, there is provided a semiconductor device comprising:

an insulating film on which wire are formed;

a semiconductor element connected to the wires and mounted on the insulating film;

a resin provided in a connection portion between the semiconductor element and the insulating film; and a supporter adhered to the semiconductor element;

the insulating film and the supporter forming at least a part of a space; and the insulating film having a portion allowing ventilation into the space from outside.

According to a third aspect of the present invention, there is provided a method of making a semiconductor device comprising the steps of:

preparing a film carrier tape having wires, a device hole, and a through-hole other than the device hole;

connecting a semiconductor element to the wires;

providing a resin in a connection portion between the semiconductor element and the film carrier tape;

stamping out from the film carrier tape an insulating film larger in size than the semiconductor element; and adhering a supporter larger in size than the semiconductor element to the semiconductor element, allowing a space to be defined at a position corresponding to the through-hole, at least a part of the space being defined by the insulating film and the supporter.

According to this method, a semiconductor device with a through-hole ventilating air from a space can be manufactured.

In this method, the resin may be provided to avoid the through-hole.

This method may further comprise a step of adhering a plate to the film carrier tape on a side on which the wires are formed and at a position avoiding the semiconductor element, the plate having plane maintenance strength higher than the plane maintenance strength of the insulating film.

According to a fourth aspect of the present invention, there is provided a circuit board on which the aforementioned semiconductor device is mounted.

According to a fifth aspect of the present invention, there is provided an electronic instrument which has the circuit board described above.

DETAILED DESCRIPTION OF THE PREFERRED EMBODIMENTS

The preferred embodiment of the present invention will now be described below in detail with reference to the accompanying drawings.

Figure 1:
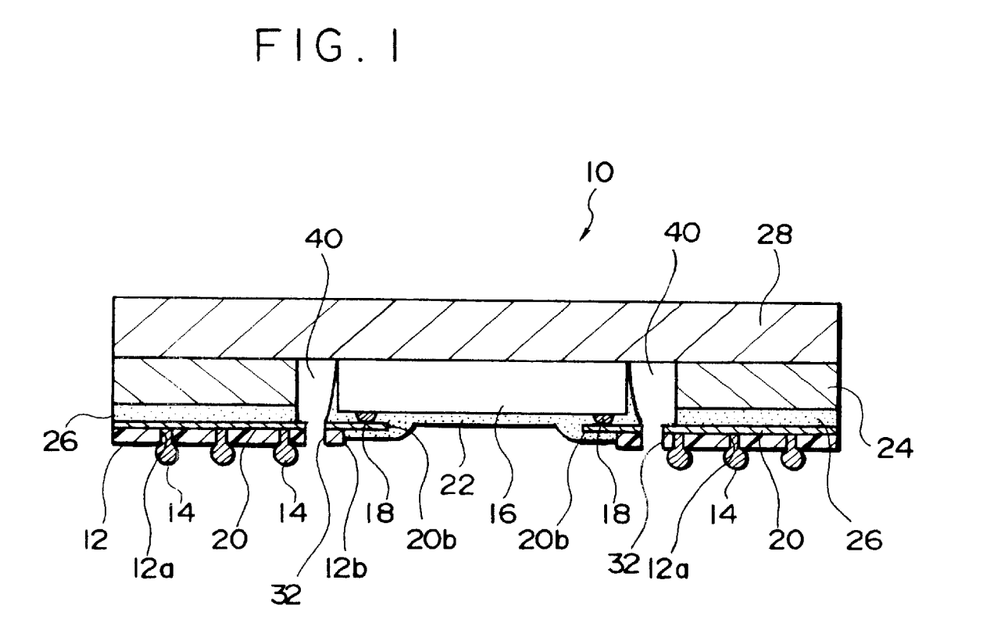
FIG. 1 shows a semiconductor device according to the embodiment of the present invention.

FIG. 1 shows a semiconductor device according to the embodiment of the present invention. The semiconductor device 10 is manufactured by using a BGA package. In FIG. 1, a plurality of bumps 14 are formed on an insulating film 12, and wires 20 connect electrodes 18 of a semiconductor chip 16 with the bumps 14.

Figure 2:
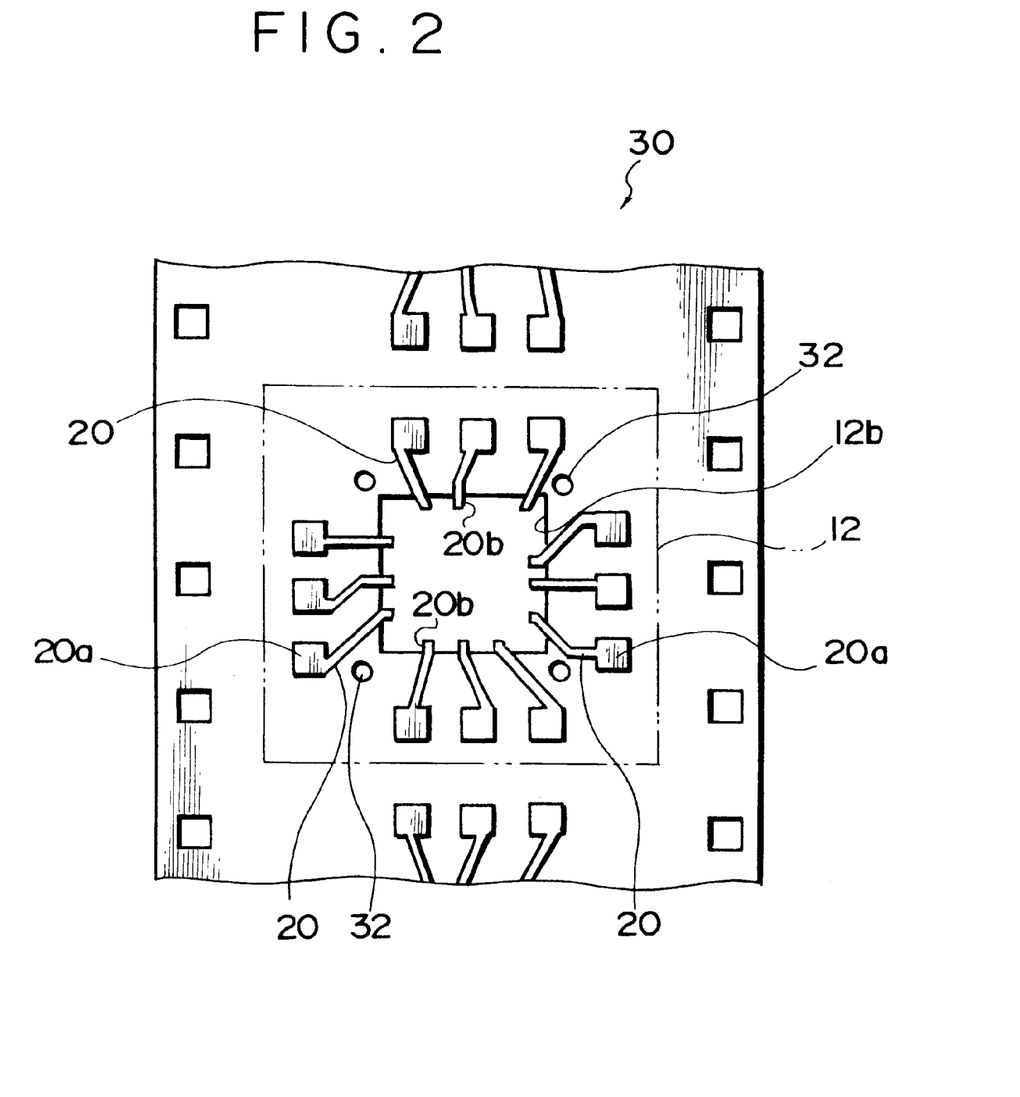
FIG. 2 shows a film carrier tape according to the embodiment of the present invention.

The insulating film 12 is obtained by punching a long size film carrier tape 30 shown in FIG. 2 along the dot-dot-dash line, when the insulating film is larger in size than the semiconductor chip 16. The insulating film 12 is formed, for example, of a polyimide resin. FIG. 2 shows the film carrier tape 30 as viewed from the side of the wires 20.

Through-holes 12a are formed on the insulating film 12, as shown in FIG. 1. The through-holes 12a are formed on lands 20a shown in FIG. 2, that is on the wires 20 formed on one side of the insulating film 12. In addition, the bumps 14 are formed in such a way as to project from the wires 20 to the other side of the insulating film 12. That is, the bumps 14 project to the opposite side of the wires 20. This makes a configuration such that the wires 20 are not exposed to a side on which bumps 14 are formed. Note that the bump 14 is made of solder, for example, and upper part of the bump is formed to be ball-shaped. The bump 14 may be formed integrally with solder to the inside of the through-hole 12a, or otherwise it may be formed in such a manner that another conductive member is provided at least in the inside of the through-hole 12a and the bump 14 made of solder or the like is attached to the upper part of the conductive member. Alternatively, for example, copper may be used instead of solder.

Furthermore, a device hole 12b is formed on the insulating film 12, and ends 20b of the wires 20 project into the device hole 12b. The device hole 12b is used for connecting ends 20b of the wires 20 and electrodes 18 of the semiconductor chip 16. That is, on the side of the insulating film 12 where the wires 20 are formed, the semiconductor chi 16 is disposed so that the electrodes 18 thereof are positioned in the inside of the device hole 12b, and subsequently the ends 20b of the wires 20 and the electrodes 18 are bonded together.

Then, a connection portion between the semiconductor chip 16 and the insulating film 12 is sealed by potting of epoxy resin 22. Moreover, the epoxy resin 22 is also applied to the device hole 12b and the periphery of the semiconductor chip 16.

In addition, in the present embodiment, a plate 24 is provided on the insulating film 12 on the side opposite to the bumps 14. The plate 24 is made of copper, stainless steel, copper alloy or the like, and it has strength capable of maintaining a planar configuration. The plate 24 is attached to the wires 20 through an insulating adhesive 26. Circumventing the semiconductor chip 16, the plate 24 is adhered to entire surface of one side of the insulating film 12. This allows the wires 20 to be covered by the insulating adhesive 26 and plate 24 for protection. In particular, the insulating adhesive 26 serves as a protective layer similar to solder resist.

The insulating adhesive 26 may be formed as a thermosetting or thermoplastic film, and adhered to the plate 24 previously. Then, the plate 24 can be thermocompression-bonded to a side of the insulating film 12 on which the wires 20 are formed.

Provision of the plate 24 also prevents the insulating film 12 from being distorted or warped. This ensures uniformity in height of the bumps 14 to improve planarity thereof, leading to enhancement in yield of mounting on circuit boards.

The plate 24 may be attached through the insulating adhesive 26 after resist is provided on the wires 20. This can prevent inclusion of impurities when the plate 24 is attached.

Further, a radiating plate 28 is adhered to the semiconductor chip 16 on a side opposite to the surface-mounted side through a thermal conductive adhesive such as silver paste. The radiating plate 28 promotes the diffusion of heat from the semiconductor chip 16, and it can be made of copper alloy, aluminum or the like. This can improve the heat radiation property of the semiconductor chip 16. The radiating plate 28 is formed to be larger in size than the semiconductor chip 16 so that the radiating plate 28 can be adhered to the plate 24. Note that there is adhesive between the plate 24 and radiating plate 28, though not shown in FIG. 1, and they are bonded together via the adhesive. Accordingly, the radiating plate 28 and semiconductor chip 16 may be adhered together using the same adhesive.

In the present embodiment, the semiconductor chip 16 is disposed between the insulating film 12 and radiating plate 28, both sizes being larger than that of the semiconductor chip 16, and the plate 24 is placed on the periphery of the semiconductor chip 16. And, a space 40 is partitioned by opposite sides of the insulating film 12 and radiating plate 28, outer periphery end sides of the semiconductor chip 16, and end sides of the plate 24 on the side of the semiconductor chip 16.

Holes 32 opening into the space 40 are formed in the insulating film 12. The space 40 is airtight except for the holes 32, and when the air or moisture in the space 40 is heated and expanded, the air or moisture can be exhausted from the holes 32. Therefore, even if the semiconductor device 10 of the present embodiment is heated in a reflow process in which the semiconductor device 10 is mounted on a circuit board, generation of cracks in the vicinity of the space 40 due to expansion of the air or moisture can be prevented.

The holes 32 are formed in the insulating film 12 near the corners of the rectangular device hole 12b, as shown in FIG. 2. The electrodes 18 of the semiconductor chip 16 are generally placed along each side of the semiconductor chip, so that the ends 20b of the wires 20 are also placed along each side of the device hole 12b. Therefore, the wires 20 are unapt to be formed at a part of the insulating film near the corners of the device hole 12b, so that there is no trouble in forming the holes 32 near the corners. The hole 32 may be a triangle or quadrangle other than a circle, and the number of the holes 32 is not limited to four, as shown in FIG. 1, it may be more than or less than four. Alternatively, the holes 32 may be formed integrally with the device hole 12b. In this case, the holes 32 are formed by changing the shape of the corners of the device hole 12b.

The present embodiment is constituted as described above and its manufacturing method will be described below.

Initially, a film carrier tape 30 of FIG. 2 is formed. As the manufacturing process is well-known, the explanation of the process is omitted. Note that it is preferred to form the device hole 12b and holes 32 simultaneously. The device hole 12b is formed by punching, as is well known in the art, so that the number of steps is not increased even if the holes 32 are punched out at the same time. In addition, the formation of the holes 32 may be performed before or after the semiconductor chip 16 is mounted on the film carrier tape 30. Specifically, when the holes 32 are formed after the semiconductor chip 16 is mounted on the film carrier tape 30 and the epoxy resin 22 is provided, the holes 32 can be prevented from being filled with the epoxy resin 22.

Then, there are executed the processes of bonding the electrodes 18 of the semiconductor chip 16 to the ends 20b of the wires 20, adhering the plate 24 to the insulating film 12 (film carrier tape 30), providing the epoxy resin 22 in the connection portion between the semiconductor chip 16 and the insulating film 12 (film carrier tape 30), punching out the insulating film 12 from the film carrier tape 30, and adhering the radiating plate 28 to the semiconductor chip 16. The sequence of these processes may be replaced.

The semiconductor device 10 described above can be obtained from the foregoing processes.

Although the present embodiment is a back TAB type in which the semiconductor chip 16 is mounted to the side opposite to the side on which the bumps 14 are formed, a front TAB type may be employed in which the semiconductor chip 16 is mounted on the side on which the bumps 14 are formed. Instead of the insulating tape 12 described above, the B-TAB type insulating film in which projections are formed integrally on the wiring side may be used.

Furthermore, a plate-shaped radiating plate 28 is used in the embodiment described above, but alternatively, a radiator member which has a lot of fins and does not have a plate-shaped configuration may also be used. A support member with no heat radiation property may also be used instead of the radiating plate 28.

Figure 3:
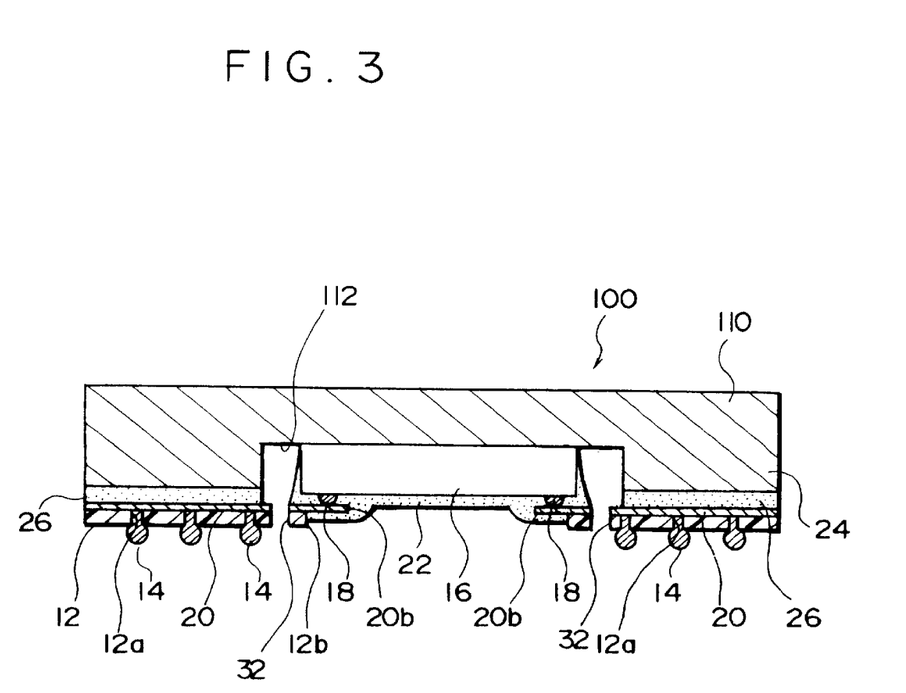
FIG. 3 shows a modification of the embodiment of the present invention.

Alternatively, a member with an integral configuration of the radiating plate 28 and plate 24 may also be used. For example, a semiconductor device 100 shown in FIG. 3 has an attachment board 110 with integral configuration of the plate 24 and radiating plate 24 shown in FIG. 1. The attachment board 110 secures the flatness of the insulating film 12 and also promotes heat radiation of the semiconductor chip 16. In the attachment board 110, a recess 112 is formed in order to make the attachment board 110 thin in an adhesion part with the semiconductor chip 16. The recess 112 can be formed by etching.

Figure 4:
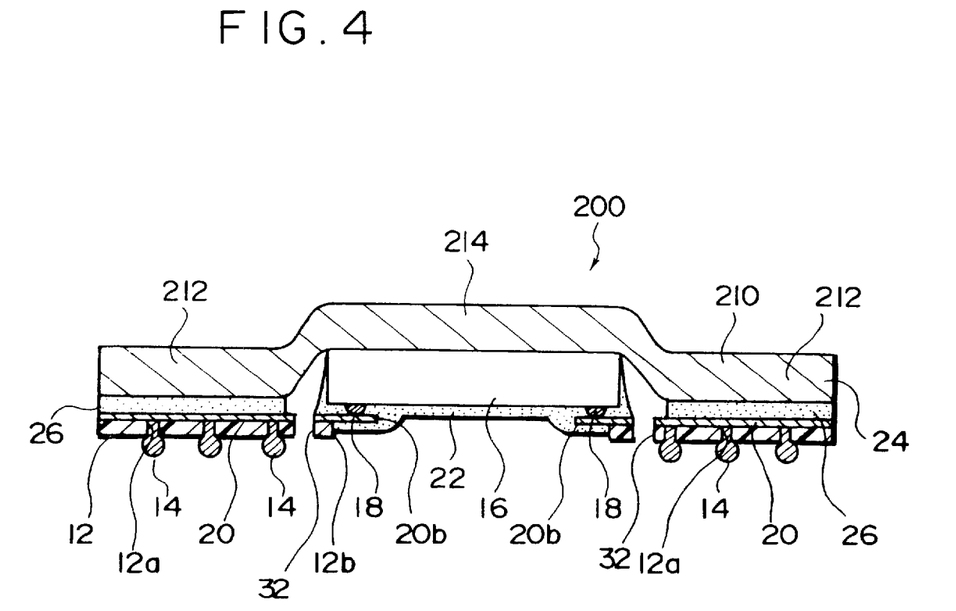
FIG. 4 shows another modification of the embodiment of the present invention.

And, a semiconductor device 200 shown in FIG. 4 is provided with an attachment board 210 having functions of the radiating plate 28 as well as the plate 24. The attachment board 210 is concaved so that a part 212 adhered to the insulating film 12 and a part 214 adhered to the semiconductor chip 16 can be manufactured integrally. Such attachment board 210 can be formed by bending process using a metal mold.

Figure 5:
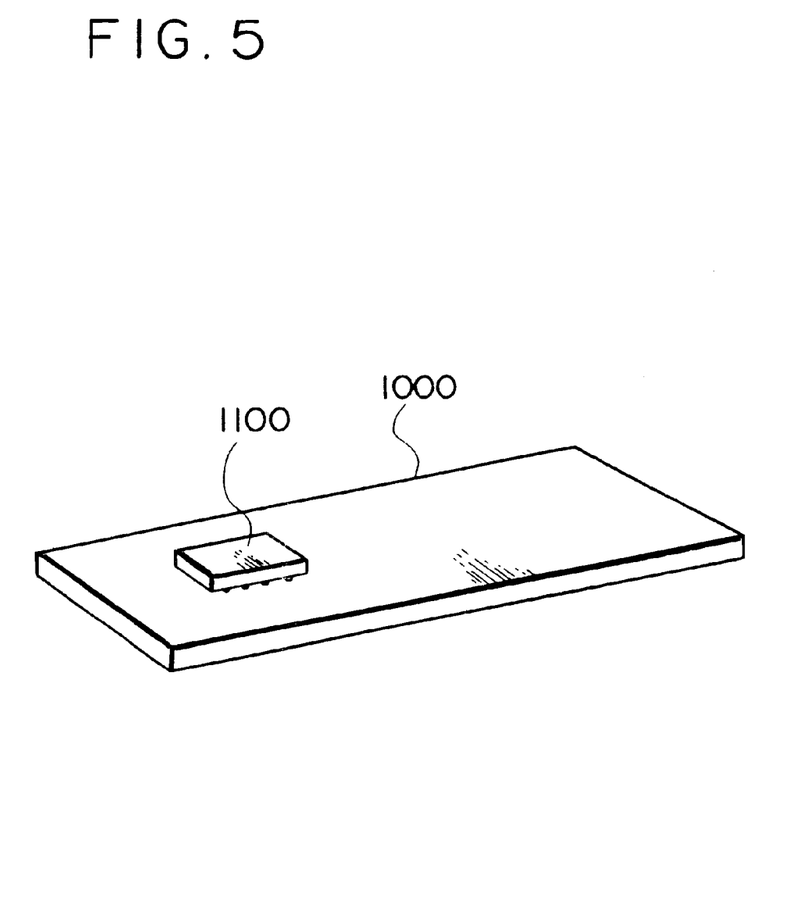
FIG. 5 shows a circuit board according to the embodiment of the present invention.

There is shown a circuit board 1000 on which is mounted a semiconductor device 1100 fabricated according to the present invention in FIG. 5. It is common practice to use a circuit board made of organic resin such as a glass epoxy resin, for example. On a circuit board, wiring patterns made of copper or the like are formed to form desired circuits, and bumps of a semiconductor device are physically connected with the wiring patterns to provide electrical conductivity. In this case, if the semiconductor device described above is provided with a structure to absorb the distortion caused by thermal expansion difference with the outside of the semiconductor device, the reliability of the semiconductor device on the circuit board can be ensured at the time of connection and thereafter. Moreover, if wiring connections of the semiconductor device are arranged suitably, reliability at the time of connection and thereafter can also be improved. In addition, the mounting area can be reduced down to that required for bare-chip mounting. Therefore, if this circuit board is used, an electric apparatus can be made compact in size. Further, more mounting space can be secured in the same area, so that more functions can be incorporated.

Figure 6:
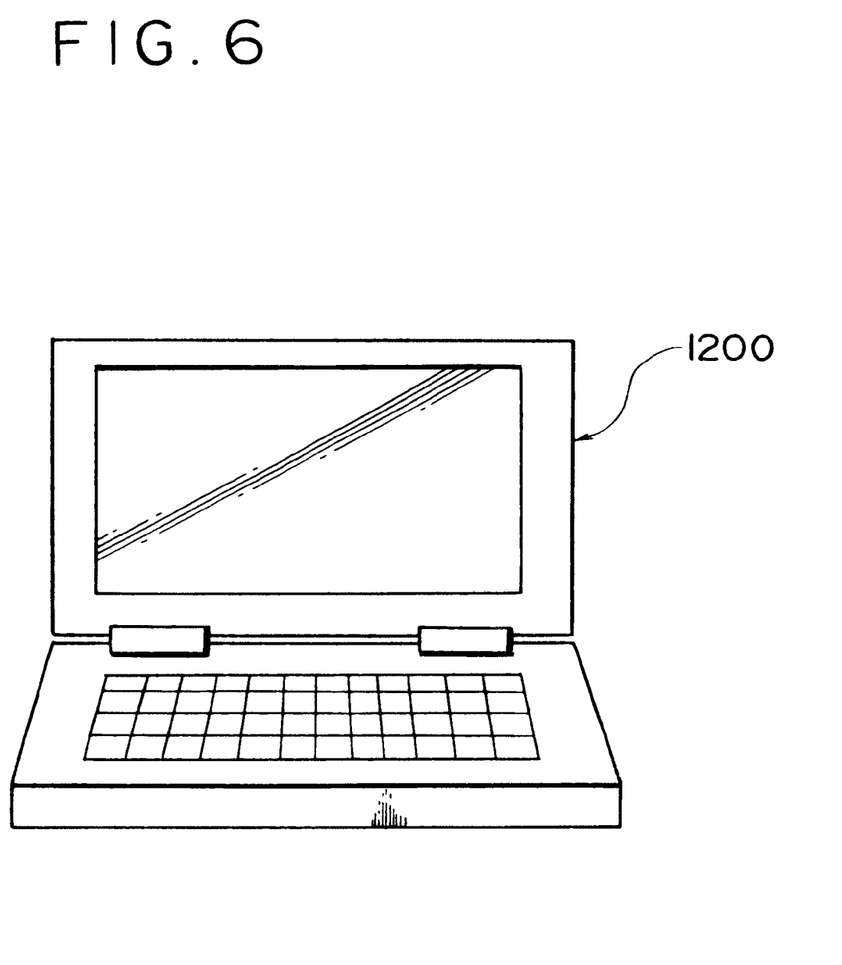
FIG. 6 shows an electronic instrument equipped with a circuit board on which is mounted the semiconductor device manufactured in accordance with the method of the present invention.

As an electronic instrument having the circuit board 1000, a notebook type personal computer 1200 is shown in FIG. 6.

By applying the present invention described above, it is also possible to fabricate surface-mounting-type electronic components (either active or passive parts) having a plurality of bumps as in semiconductor devices, for example, such electronic components as resistors, capacitors, coils, oscillators, filters, temperature sensors, thermistors, varistors, variable resistors, and fuses.

What is claimed is:

1. A semiconductor device comprising:

an insulating film on which wires are formed and in which a through-hole is formed;

a semiconductor element connected to said wires;

a resin provided in a connection portion between said semiconductor element and said insulating film; and a supporter adhered to said semiconductor element, said insulating film and said supporter defining at least a part of a space, and said space being opened to said through-hole for ventilation from outside and having a cross-sectional area different from a cross-sectional area of the through hole, said cross-sectional area of said through-hole being smaller than said cross-sectional area of said space, wherein a rectangular device hole is formed in said insulating film and said through-hole is formed in said insulating film in the vicinity of said device hole.

2. The semiconductor device as defined in claim 1, wherein said resin is provided to avoid said through-hole.

3. The semiconductor device as defined in claim 1, wherein said supporter accelerates diffusion of heat from said semiconductor element.

4. The semiconductor device as defined in claim 1, further comprising a plate with plane maintenance strength higher than the plane maintenance strength of said insulating film, adhered to a position in said insulating film avoiding said semiconductor element;

wherein contours of said insulating film and said supporter are formed to be larger than the contour of said semiconductor element; and wherein said space is formed in an area defined by opposite sides of said insulating film and said supporter, outer peripheral end sides of said semiconductor element, and end sides of said plate on a side of said semiconductor element.

5. The semiconductor device as defined in claim 4, further comprising external electrodes formed on a first side of said insulating film opposite to a second side of said insulating film on which said wires are formed, said external electrodes being connected to said wires through said insulating film at positions outside of said semiconductor element;

wherein said semiconductor element is adhered to said wires of said insulating film with an active surface of said semiconductor element facing said wires;

wherein said plate is adhered to said second side of said insulating film at a position outside of said semiconductor element; and wherein said supporter is adhered to said semiconductor element on a side opposite to said active surface and also to said plate on a side opposite to a side to which said insulating film is adhered.

6. The semiconductor device as defined in claim 1, wherein contours of said insulating film and said supporter are formed to be larger than the contour of said semiconductor element;

wherein said supporter has plane maintenance strength higher than the plane maintenance strength of said insulating film and is adhered to said insulating film and said semiconductor element; and wherein said space is formed in an area defined by opposite sides of said insulating film and said supporter, outer peripheral end sides of said semiconductor element, and end sides of said supporter on a side of said semiconductor element.

7. The semiconductor device as defined in claim 1, wherein said wires are formed on said insulating film avoiding the vicinity of corners of said device hole; and wherein said through-hole is formed in said insulating film in the vicinity of corners of said device hole.

8. The semiconductor device as defined in claim 4, wherein said wires are formed on said insulating film avoiding the vicinity of corners of said device hole; and wherein said through-hole is formed in said insulating film in the vicinity of corners of said device hole.

9. The semiconductor device as defined in claim 5, wherein said wires are formed on said insulating film avoiding the vicinity of corners of said device hole; and wherein said through-hole is formed in said insulating film in the vicinity of corners of said device hole.

10. The semiconductor device as defined in claim 6, wherein said wires are formed on said insulating film avoiding the vicinity of corners of said device hole; and wherein said through-hole is formed in said insulating film in the vicinity of corners of said device hole.

11. A circuit board on which a semiconductor device as defined in claim 1 is mounted.

12. A circuit board on which a semiconductor device as defined in claim 4 is mounted.

13. A circuit board on which a semiconductor device as defined in claim 6 is mounted.

14. An electronic instrument which has a circuit board as defined in claim 11.

15. An electronic instrument which has a circuit board as defined in claim 12.

16. An electronic instrument which has a circuit board as defined in claim 13.

17. A method of making a semiconductor device comprising:

preparing an insulating film on which wires are formed and in which a through-hole is formed;

connecting a semiconductor element to said wires;

providing a resin in a connection portion between said semiconductor element and said insulating film;

adhering a supporter to said semiconductor element to define at least a part of a space, said space being opened to said through-hole and having a cross-sectional area different from a cross-sectional area of the through hole, said cross-sectional area of said through-hole being smaller than said cross-sectional area of said space, wherein a rectangular device hole is formed in said insulating film and said through-hole is formed in said insulating film in the vicinity of said device hole.

18. The method of claim 17, wherein preparing the insulating film comprises preparing a film carrier tape having said wires, the through-hole and a device hole other than the through-hole; and providing the resin comprises providing the resin in a connection portion between said semiconductor element and said film carrier tape.

19. The method of claim 18, further comprising stamping out from said film carrier tape an insulating film larger in size than said semiconductor element;

wherein, adhering the supporter comprises adhering a supporter larger in size than said semiconductor element, allowing a space to be defined at a position corresponding to said through-hole, at least a part of said space being defined by said insulating film and said supporter.

20. The method of claim 18, further comprising adhering a plate to said film carrier tape on a side on which said wires are formed and at a position avoiding said semiconductor element, said plate having plane maintenance strength higher than the plane maintenance strength of said insulating film.

21. The method of claim 17, wherein said resin is provided to avoid said through-hole.

22. A semiconductor device comprising:

an insulating film on which wires are formed and in which a through-hole is formed;

a semiconductor element electrically connected to said wires;

a resin provided in a connection portion between said semiconductor element and said insulating film; and a supporter adhered to said semiconductor element, at least said insulating film and said supporter defining a space adjacent to the semiconductor element, the through-hole forming an opening into the space, wherein said wires do not overlap said through-hole.

23. The semiconductor device as defined in claim 22, wherein said resin defines a part of said space.

24. A semiconductor device comprising:

an insulating film on which wires are formed and in which a through-hole is formed:

a semiconductor element electrically connected to said wires;

a sealing material provided in a connection portion between said semiconductor element and said insulating film; and a supporter adhered to said semiconductor element, at least said insulating film, said supporter and said sealing material defining a space adjacent to the semiconductor element, the through-hole forming an opening into the space, wherein said wires do not overlap said through-hole.

25. A semiconductor device comprising:

an attachment board on which is formed a recess;

an insulating film on which wires are formed and in which a through-hole is formed, said insulating film adhered to said attachment board around said recess; and a semiconductor element positioned inside said recess and electrically connected to said wires, at least said insulating film and said attachment board defining a space adjacent to the semiconductor element, the through-hole forming an opening into the space, wherein said wires do not overlap said through-hole.

26. The semiconductor device as defined in claim 25, wherein a device hole is formed in said insulating film inside said recess, said wires extend into said device hole, and said semiconductor element is electrically connected to said extended portions of said wires into said device hole.

27. A semiconductor device comprising:

an insulating film on which wires are formed and in which a through-hole is formed;

a semiconductor element electrically connected to said wires;

a resin provided in a connection portion between said semiconductor element and said insulating film; and a supporter adhered to said semiconductor element, said insulating film and said supporter defining at least a part of a space, and said space being opened to said through-hole and having a cross-sectional area different from a cross-sectional area of the through hole, said cross-sectional area of said through-hole being smaller than said cross-sectional area of said space, wherein a rectangular device hole is formed in said insulating film and said through-hole is formed in said insulating film in the vicinity of said device hole.

28. A semiconductor device comprising:

an insulating and flexible substrate on which wires are formed and in which a through-hole is formed;

a semiconductor element electrically connected to said wires;

a resin provided in a connection portion between said semiconductor element and said insulating and flexible substrate; and a supporter adhered to said semiconductor element, said insulating and flexible substrate and said supporter defining at least a part of a space, and said space being opened to said through-hole for ventilation from outside and having a cross-sectional area different from a cross-sectional area of the through hole, said cross-sectional area of said through-hole being smaller than said cross-sectional area of said space, wherein a rectangular device hole is formed in said insulating and flexible film and wherein said through-hole is formed in said insulating and flexible film in the vicinity of said device hole.

29. A semiconductor device comprising:

an insulating film on which wires are formed and in which a through-hole and a device hole are formed, said through-hole formed integrally with said device hole, said wires extending into said device hole;

a semiconductor element positioned inside said device hole and electrically connected to said wires inside said device hole;

a resin sealing a connection portion between said semiconductor element and said insulating film inside said device hole; and a supporter adhered to said semiconductor element, at least said insulating film and said supporter defining a space adjacent to the semiconductor element, the through-hole forming an opening into the space, wherein said wires do not overlap said through-hole.

30. A method of making a semiconductor device comprising:

preparing an insulating film on which wires are formed and in which a through-hole is formed;

connecting a semiconductor element to said wires;

providing a resin in a connection portion between said semiconductor element and said insulating film; and adhering a supporter to said semiconductor element to define a space, said space defined by at least said insulating film and said supporter, said space being defined adjacent to said semiconductor element, said through-hole forming an opening into said space, wherein said wires do not overlap said through-hole.

31. A semiconductor device comprising:

an insulating film on which wires are formed and in which a through-hole is formed;

a semiconductor element connected to said wires;

a resin provided in a connection portion between said semiconductor element and said insulating film; and a supporter adhered to said semiconductor element, said insulating film and said supporter defining at least a part of a space, and said space being opened to said through-hole for ventilation from outside and having a cross-sectional area different from a cross-sectional area of the through hole when said cross-sectional areas are defined on axes parallel to a length of the supporter, wherein a rectangular device hole is formed in said insulating film and said through-hole is formed in said insulating film in the vicinity of said device hole.

32. A method of making a semiconductor device comprising:

preparing an insulating film on which wires are formed and in which a through-hole is formed;

connecting a semiconductor element to said wires;

providing a resin in a connection portion between said semiconductor element and said insulating film;

adhering a supporter to said semiconductor element to define at least a part of a space, said space being opened to said through-hole and having a cross-sectional area different from a cross-sectional area of the through hole when said cross-sectional area are defined on axes parallel to a length of the supporter, wherein a rectangular device hole is formed in said insulating film and said through-hole is formed in said insulating film in the vicinity of said device hole.

33. A semiconductor device comprising:

an insulating film on which wires are formed and in which a through-hole is formed;

a semiconductor element electrically connected to said wires;

a resin provided in a connection portion between said semiconductor element and said insulating film; and a supporter adhered to said semiconductor element, said insulating film and said supporter defining at least a part of a space, and said space being opened to said through-hole and having a cross-sectional area different from a cross-sectional area of the through hole when said cross-sectional area are defined on axes parallel to a length of the supporter, wherein a rectangular device hole is formed in said insulating film and said through-hole is formed in said insulating film in the vicinity of said device hole.

34. A semiconductor device comprising:

an insulating and flexible substrate on which wires are formed and in which a through-hole is formed;

a semiconductor element electrically connected to said wires;

a resin provided in a connection portion between said semiconductor element and said insulating and flexible substrate; and a supporter adhered to said semiconductor element, said insulating and flexible substrate and said supporter defining at least a part of a space, and said space being opened to said through-hole for ventilation from outside and having a cross-sectional area different from a cross-sectional area of the through hole when said cross-sectional area are defined on axes parallel to a length of the supporter, wherein a rectangular device hole is formed in said insulating and flexible film and wherein said through-hole is formed in said insulating and flexible film in the vicinity of said device hole.

* * * * *